United States Patent [19]

Paluck et al.

[11] 3,969,633
[45] July 13, 1976

[54] SELF-BIASED TRINARY INPUT CIRCUIT FOR MOSFET INTEGRATED CIRCUIT

[75] Inventors: Robert John Paluck, Carrollton; Robert James Proebsting, Richardson, both of Tex.

[73] Assignee: Mostek Corporation, Carrollton, Tex.

[22] Filed: Jan. 8, 1975

[21] Appl. No.: 539,392

[52] U.S. Cl. .............................. 307/205; 307/209; 307/214; 307/244
[51] Int. Cl.² .................. H03K 19/08; H03K 19/40; H03K 17/18
[58] Field of Search .......... 307/205, 209, 214, 244, 307/235 R, 235 T, 235 E, 235 N, 235 U, 304

[56] References Cited
UNITED STATES PATENTS

| | | | |
|---|---|---|---|
| 3,609,411 | 9/1971 | Ma et al. | 307/205 X |
| 3,700,981 | 10/1972 | Masuhara et al. | 307/205 X |
| 3,832,576 | 8/1974 | Proebsting | 307/209 |
| 3,836,790 | 9/1974 | Becker | 307/235 R |
| 3,851,189 | 11/1974 | Moyer | 307/235 X |

*Primary Examiner*—John S. Heyman
*Assistant Examiner*—L. N. Anagnos
*Attorney, Agent, or Firm*—Hubbard, Thurman, Turner & Tucker

[57] ABSTRACT

A trinary input circit for an MOSFET integrated circuit includes a biasing stage formed by using a standard inverter, whose output is connected to its input so as to establish a particular bias voltage level when the input to the trinary input circuit is left floating. The output of the biasing stage is applied to the inputs of a second inverter stage having a higher beta ratio than the bias stage and to the input of a third inverter stage having a lower beta ratio. The bias stage when left open circuited will seek a quiescent voltage which is above the switching threshold of the second stage and below the switching threshold of the third stage. Thus, as a result of the relative beta ratios of the three stages when the input to the bias stage is left open, the bias stage will seek a particular voltage level such that the high beta ratio stage produces a logic 0 output and the low beta ratio stage produces a logic 1 output. When a voltage greater than a certain value which is defined as a logic 1 is applied to the input, thus overriding the biasing stage, both the second and third inverter stages produce logic 0 outputs and, when a voltage less than a certain value which is defined as a logic 0 is applied to the input, to override the biasing stage, both inverters produce a logic 1. Three logic input conditions are therefore defined by two signals for use within the integrated circuit chip.

9 Claims, 3 Drawing Figures

SELF-BIASED TRINARY INPUT CIRCUIT FOR MOSFET INTEGRATED CIRCUIT

This invention relates generally to integrated logic circuits, and more particularly relates to a tri-level logic input circuit for an MOSFET integrated circuit.

The advent of large scale MOSFET integrated circuits has made hand-held portable calculators and digital electronic clocks a reality. Similar circuits are also used for a wide variety of automated systems which employ random access memories, read-only memories and the like. Such circuits are commonly mounted in hermatically sealed packages which are commercially available from a number of suppliers in standard sizes having various standard numbers of pins in standard configurations. These standardized packages are significant in that standardized connector sockets are also readily available to the industry from a number of suppliers. In the production of such integrated circuits, the reduction of the number of connector pins required to provide the necessary power supply and logic information to and from the integrated circuit is a significant factor.

The present invention is concerned with a method and implementing circuitry by which three different logic conditions can be input over a single channel, i.e., connector pin, to the interior circuitry as compared to the more customary two logic levels for each pin, to increase the circuit's functionality without increasing the number of package connector pins required. The operation of the circuit is based on the relative beta ratios of a set of inverter stages. The beta ratio of an inverter is a value which describes the relative conductance of the inverter's driver transistor to the load transistor. It is defined as the ratio of width/length of the driver to the width/length of the load. In accordance with the present invention, voltages an amount above and below a bias voltage, for example, provide two input logic levels, and an open circuit provides a third input logic state. The trinary logic states are applied to the input of a bias stage consisting of a standard inverter stage modified by making the input and output nodes electrically common. The bias voltage established by this bias stage is applied to the input of a second inverter stage having a higher beta ratio, and to the input of a third inverter stage having a lower beta ratio. The beta ratios of the biasing stage, and the second and third inverter stages are such that when the trinary logic input is an open circuit the bias circuit will seek a voltage level such that the output from the second inverter stage is a logic 0 level, and the output from the third inverter stage is a logic 1. When a logic 1 voltage is applied to the logic input, both the second and third inverter stages produce a logic 0 level, and when a logic 0 level is applied to the logic input, both the second and third inverter stages produce a logic 1. Additional inverting stages may be added after the second and third inverter stages to further improve the resulting digital output, but depending on operating and design conditions the additional stages may not be necessary.

An important aspect of the present invention is that only the relative beta ratios of the three stages need be maintained to ensure proper operation of the circuit, and the relative beta ratios of the stages are determined only upon the geometries of the MOSFET devices making up the stages. All variations in the transfer characteristics of the stages resulting from the normal variations in production processing or applied supply voltage affect the absolute transfer characteristics of the various stages, but not the relative transfer characteristics.

The novel features believed characteristic of this invention are set forth in the appended claims. The inventon itself, however, as well as other objects and advantages thereof, may best be understood by reference to the following detailed description of an illustrative embodiment, when read in conjunction with the accompanying drawings, wherein:

Figure 1:
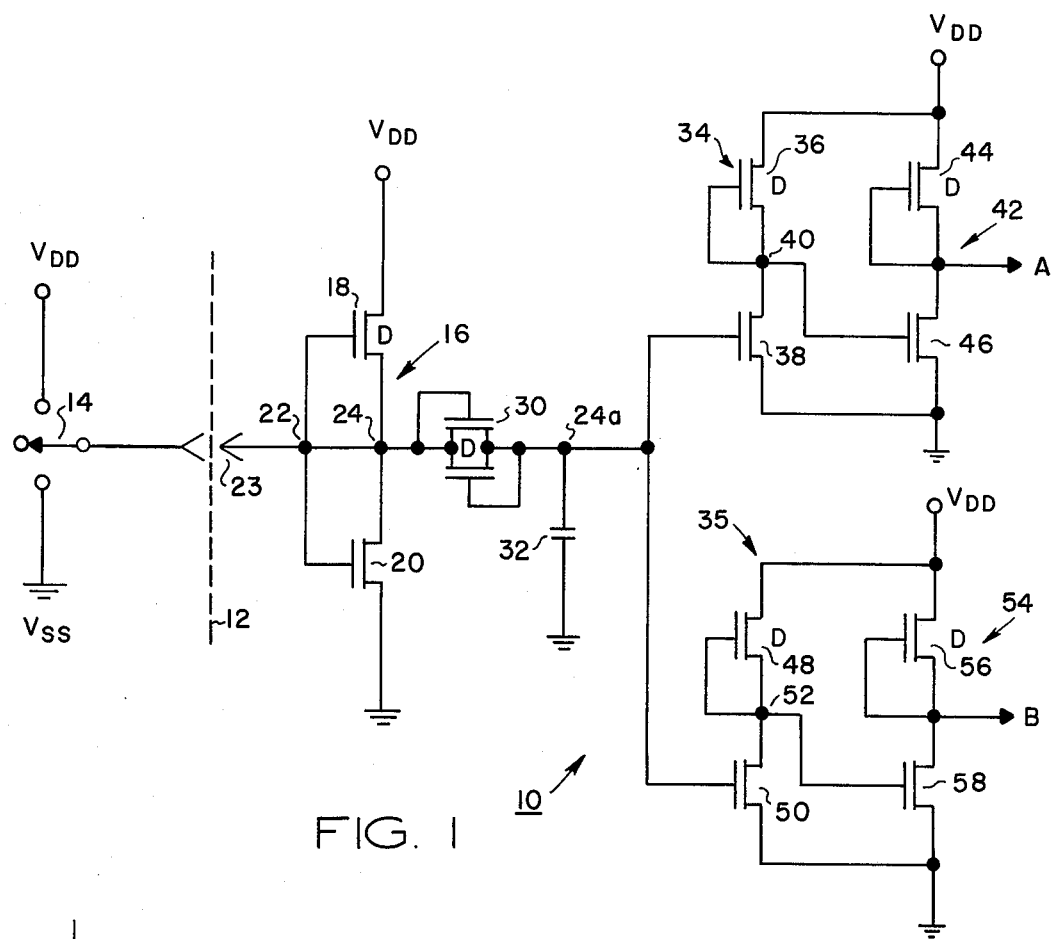
FIG. 1 is a schematic circuit diagram of a trinary-to-binary input circuit in accordance with the present invention.

Referring now to the drawings, an embodiment of the circuit of the present invention is indicated generally by the refrence numeral 10. The circuit 10 is preferably fabricated using conventional process technology to produce both depletion and enhancement mode MOSFET devices on a single integrated circuit, although the use of depletion mode transistors is not necessary to the invention. The portion of the circuit to the left of the dotted line 12 is external to the integrated circuit and produces a tri-level logic input and includes a switch 14 which is shown in the open circuit position, but which may be switched to $V_{DD}$ for a logic 1 input or to $V_{SS}$ for a logic 0 input. As will hereafter be described, the various input levels need not be $V_{DD}$ or $V_{SS}$ and may even be an analog input.

A bias stage 16 is comprised of a conventional inverter stage, including a depletion mode transistor 18 and enhancement mode transistor 20, in which the input node and output nodes are permanently made electrically common. The depletion mode transistor 18 is commonly referred to as the load device, and the enhancement mode transistor 20 as the driver device. The input node 22 of this inverter stage 16 is connected to the pin 23 of the integrated circuit. The output node 24, which is electrically common with the input node 22, is also connected to the gate of the load transistor 18. The beta ratio, i.e., the ratio of the width/length ratio of the channel of the driver transistor 20 divided by the width/length ratio of the channel of load transistor 18 is such that the bias stage would have a voltage transfer curve as represented by the dotted line 16a in FIG. 2 if the input and output nodes were not electrically common. However, as a result of connecting the output node 24 back to the input node 22, the input and output voltages will always be the same, as represented by the solid line 16 b in FIG. 2. As a result, when the switch 14 is in the open circuit position, the voltage on output node 24 will be that represented by point 16c in FIG. 2.

The output node 24 of the first bias stage 16 is connected through a pair of back-to-back depletion mode transistors 30, the gates of which are connected as shown, to the inputs of second and third inverter stages 34 and 35. The transistors 30 and capacitor 32 form a low pass filter which is designed to filter out spurious signals above the input operating frequency. For many applications such as circuits which must operate with low power, the input biasing stage will be a high impedance and thus may be susceptible to noise. For proper circuit operation, the filter must reject the unwanted signals. The filter need not be included for those designs in which noise problems will not be encountered. While the back-to-back configuration of depletion mode transistors is preferred, it should also be understood that either of the depletion transistors can be used without the other, and that an enhancement mode transistor may also be used in which case the gate would be connected to a suitable supply voltage such as $V_{DD}$.

The second inverter stage 34 is comprised of depletion mode transistor 36, and enhancement mode transistor 38. Again, the output node 40 of the stage is connected to the gate of transistor 36 so that the advantages of a depletion load with constant gate to source voltage can be realized. The width/length ratios of transistors 36 and 38 are selected so that the stage 34 has a relatively high beta ratio and its voltage transfer characteristic is represented by line 34a in FIG. 2.

The third inverter stage 35 is comprised of depletion mode transistor 48 and enhancement mode transistor 50. The output node 52 is connected back to the gate of transistor 48 so that the advantages of a depletion load with constant gate to source voltage can be realized. The geometries of transistors 48 and 50 are selected such that inverter stage 35 has a relatively low beta ratio with a transfer characteristic represented by the line 35a in FIG. 2.

Inverter stage 34 is followed by an additional inverting stage 42 comprised of depletion transistor 44 and enhancement transistor 46. The geometries of transistors 44 and 46 are selected so that the stage 42 has a relatively low beta ratio for purposes which will presently be described. The output of stage 42 is designated as binary logic output A. The output from stage 35 is applied to another inverting stage 54, which is comprised of depletion mode transistors 56 and enhancement mode transistor 58. Inverter stage 54 has a relatively high beta ratio. The output of stage 54 is designated as binary logic output B. In practice, inverter stage 42 may have substantially the same geometry and, therefore, the same voltage transfer characteristics as inverter stage 35, and inverter stage 54 may have substantially the same voltage transfer characteristics as inverter stage 34. Thus, for purposes of this discussion, the line 34a in FIG. 2 may also represent the transfer functions of stage 54 and line 35a may represent the transfer characteristics of amplifier stage 42.

If desired, enhancement mode transistors may be used as load devices instead of the depletion mode transistors as illustrated, in which case the gate nodes of the enhancement mode devices would be connected to $V_{DD}$, or a separate supply voltage. In this case, the transfer characteristics of the stage would be somewhat different from that shown in the drawings, as is known in the art.

Figure 2:
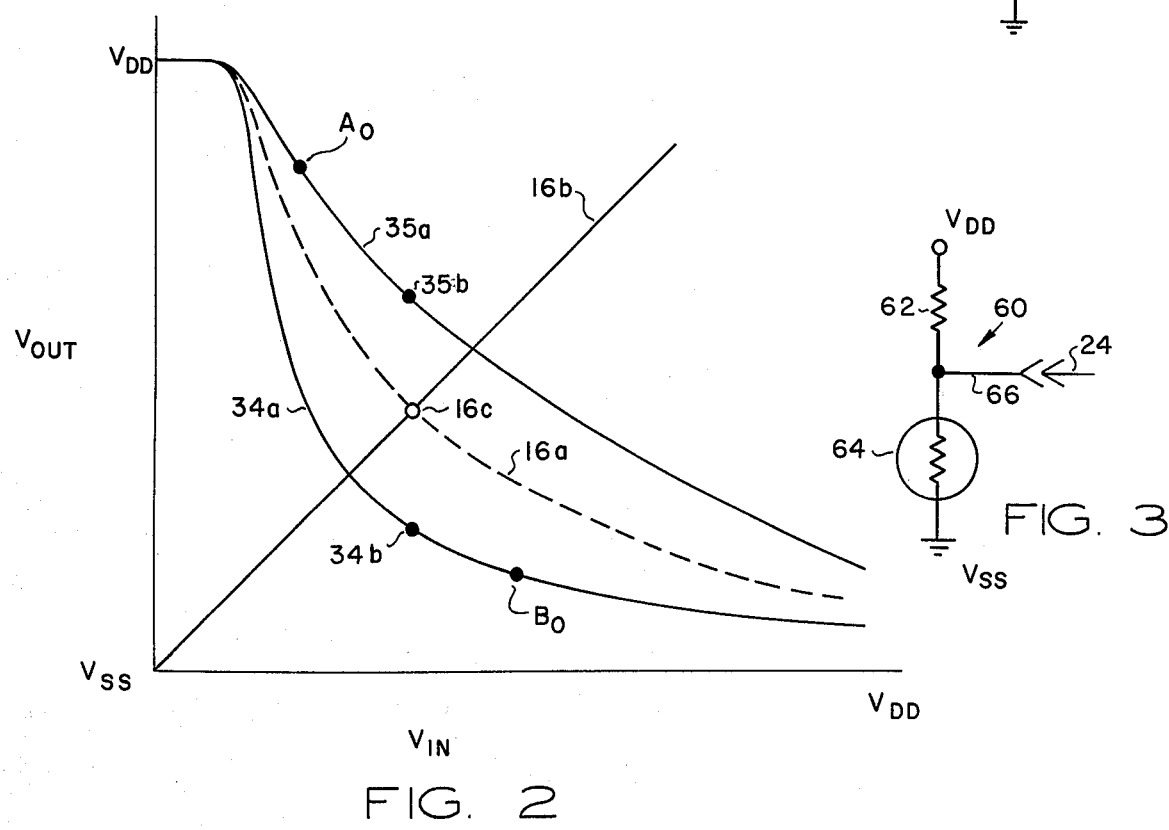
FIG. 2 is a graph illustrating the voltage transfer characteristics of the bias stage and the two inverter stages of the circuit of FIG. 1.

In the operation of the circuit 10 illustrated in FIGS. 1 and 2, assume first that the switch 14 is connected to $V_{SS}$ so that a logic 0 is applied to the input node 22 of the bias stage. The voltage at output node 24 will, of course, be at the same voltage as will the voltage on node 24a under steady state conditions so that the voltage levels on output nodes 40 and 52 of the second and third inverter stages will be at $V_{DD}$. The input nodes of stages 42 and 54 will then both be at $V_{DD}$ and the beta ratios of these inverters are designed such that the logic outputs A and B will be low, i.e., at a logic 0 level.

When the switch 14 is connected to $V_{DD}$ for the example shown in FIGS. 1 and 2, output nodes 24 and 24a will also be at $V_{DD}$. This high level is thus applied to the inputs of stages 34 and 35 so that the outputs from both stages 34 and 35 go to a low level, which, in turn, causes both outputs A and B of stages 42 and 54 to approach $V_{DD}$, which in each case is a logic 1 level.

In the general case, input node 24 need not be connected to $V_{SS}$ or $V_{DD}$ as described above. By appropriately setting the relative beta ratios of the inverters, bringing node 24 above a certain voltage level will cause both outputs to go high, and conversely bringing node 24 below a certain voltage will cause both outputs to go low.

If the switch 14 is placed in the open circuit condition as illustrated, the output node 24 of the bias stage goes to a voltage represented by point 16c in FIG. 2 as previously described. When this voltage is applied as an input to stage 34, output node 40 of stage 34 is at point 34b in FIG. 2. With the output voltage represented by point 34b being input to stage 42 and curve 35a representing the transfer characteristic of stage 42, the voltage on logic output A would then be as represented at point $A_0$ in FIG. 2, which is at a level defined as logic 1. Conversely, as a result of the voltage represented by point 16c being applied to the input of stage 35, the voltage on output node 52 of stage 35 is represented by point 35b in FIG. 2. Since the voltage represented by point 35b is the input voltage to stage 54, the transfer characteristics of which are also represented by curve 34a, the voltage of logic output B would then be represented by point $B_0$ in FIG. 2, which is defined as a logic 0. Thus, for the open circuit input stage, logic output A is at a logic 1 level, and logic output B is at a logic 0 level.

Figure 3:
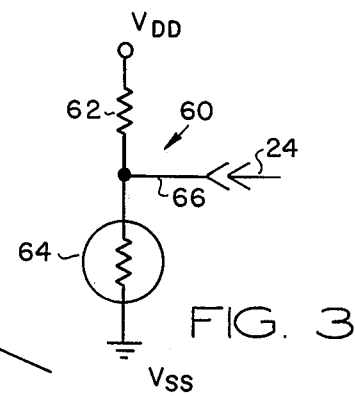
FIG. 3 is a schematic circuit diagram of an alternative external trinary input circuit which may be substituted for the external trinary input circuit and the bias stage of the circuit illustrated in FIG. 1.

An alternative input circuit is indicated generally by the reference numeral 60 in FIG. 3 and is comprised of a resistive network including a fixed resistor 62 and a variable resistor 64 connected as a voltage divider between $V_{DD}$ and $V_{SS}$. The center node 66 provides the input to the connector pin 24 of the integrated circuit 10. The circuit 60 is used primarily to illustrate that the tri-level input to the circuit 10 may be an analog signal varying continuously from a value near $V_{DD}$ to a value near $V_{SS}$ as the resistive value of the variable resistor 64 changes. Thus, the circuit 10 can be used to digitally detect and logically define three separate regions of any variable condition represented by the analog signal. For example, a low value of the resistor 64 would provide a voltage near $V_{SS}$ in which case both logic outputs A and B will be at a logic 0 level. As the value of resistor 64 increases, logic output A would first transition to a logic 1 level at some intermediate value while output B remained at logic 0 to define a second state, and then logic output B would also transition to a logic 1 level at still another higher value to define a third state. In cases where it is desired to only use the input circuit 60, the bias stage 16 may be omitted from the circuit.

It is important to note that since all inverter stages are of substantially the same configuration, and since all load transistors are made by the same process steps and all driver transistors are made by the same process steps, the transfer characteristics of the individual stages will track each other and are set by the relative sizes of the transistors. The bias point set by the bias stage will track the changes in the transfer characteristics of the other inverter stages. As a result, the circuit can be used with great reliability over a wide range of process and power supply variation.

Although preferred embodiments of the invention have been described in detail, it is to be understood that various changes, substitutions and alterations can be made therein without departing from the spirit and scope of the inventions as defined by the appended claims.

What is claimed is:

1. In an integrated MOSFET circuit, a trinary to binary input circuit comprising:
    a bias stage comprised of a first inverter stage having an input connected to receive a logic input to the integrated circuit and an output electrically common with the input;
    a second inverter stage having a beta ratio greater than that of the first stage and having an input connected to the output of the first stage; and
    a third inverter stage having a beta ratio less than that of the first stage and having an input connected to the output of the first stage;
    whereby when the logic input is an open circuit, the logic output of the second inverter stage will be at one binary logic level and the output of the third inverter stage will be at another binary logic level, and when the logic input is at a logic 1 level the outputs of both the second and third inverter stages will be at one binary logic level and when the logic input is at a logic 0 level the outputs of both the second and third inverter stages will be at another binary logic level.

2. The trinary to binary input circuit of claim 1 wherein the bias stage and the second and third inverter stages have circuit configurations for maintaining substantially the same relative transfer characteristics as the operating characteristics of the individual circuit components vary because of variations in production processing.

3. The trinary to binary input circuit of claim 1 wherein the bias stage and the second and third inverter stages are each comprised of a depletion mode load transistor interconnecting a drain supply voltage node and an output node for the respective stage and an enhancement mode driver transistor interconnecting said respective output node and a source supply voltage node.

4. The trinary to binary input circuit of claim 1 wherein the bias stage and the second and third inverter stages are each comprised of an enhancement mode load transistor interconnecting a drain supply voltage node and an output node for the respective stage and an enhancement mode driver transistor interconnecting said respective output node and a source supply voltage node.

5. The trinary to binary input circuit of claim 1 further characterized by
    a fourth inverter stage connected to receive the output from the second inverter stage, the fourth inverter stage having a relatively low beta ratio as compared to the beta ratio of the second inverter stage; and
    a fifth inverter stage connected to receive the output from the third inverter stage, the fifth inverter stage having a relatively high beta ratio as compared to the beta ratio of the third inverter stage.

6. The trinary to binary input circuit of claim 1 further characterized by a low pass filter network connecting the output of the bias stage to the electrically common input nodes of the second and third inverter stages.

7. The trinary to binary input circuit of claim 6 wherein the filter network comprises a resistance connected between the output of the bias stage and the inputs of the second and third inverter stages, and a capacitor coupling the inputs of the second and third inverter stages to a supply voltage.

8. The trinary to binary input circuit of claim 1 further characterized by logic circuit means external to the integrated MOSFET circuit for selectively applying predetermined logic 0 and logic 1 voltage levels and an open circuit as a third logic state.

9. The trinary to binary input circuit of claim 1 further characterized by circuit means external to the integrated MOSFET circuit for applying an analog voltage to the input of the first inverter stage which varies from a level below a first threshold voltage to a level above a second, higher threshold voltage.

* * * * *